(12) United States Patent
Chen et al.

(10) Patent No.: US 8,199,563 B2
(45) Date of Patent: Jun. 12, 2012

(54) TRANSMISSION GATE-BASED SPIN-TRANSFER TORQUE MEMORY UNIT

(75) Inventors: Yiran Chen, Eden Prairie, MN (US); Hai Li, Eden Prairie, MN (US); Hongyue Liu, Maple Grove, MN (US); Yong Lu, Rosemount, MN (US); Yang Li, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/149,136

(22) Filed: May 31, 2011

(65) Prior Publication Data
US 2011/0228598 A1 Sep. 22, 2011

Related U.S. Application Data

(63) Continuation of application No. 12/170,549, filed on Jul. 10, 2008, now Pat. No. 7,974,119.

(51) Int. Cl.
*G11C 11/00* (2006.01)
(52) U.S. Cl. ......... 365/158; 365/148; 365/171; 977/935
(58) Field of Classification Search .................. 365/80, 365/83, 85, 148, 158, 171, 173; 257/421, 257/E21.665; 438/3; 977/933–935
See application file for complete search history.

(56) References Cited

U.S. PATENT DOCUMENTS

| | | | |
|---|---|---|---|
| 3,982,233 A | 9/1976 | Crookshanks | |
| 3,982,235 A | 9/1976 | Bennett | |
| 4,056,642 A | 11/1977 | Saxena | |
| 4,110,488 A | 8/1978 | Risko | |
| 4,160,988 A | 7/1979 | Russell | |
| 4,232,057 A | 11/1980 | Ray | |
| 4,247,915 A | 1/1981 | Bartlett | |
| 4,323,589 A | 4/1982 | Ray | |
| 4,576,829 A | 3/1986 | Kaganowicz | |
| 4,901,132 A | 2/1990 | Kuwano | |

(Continued)

FOREIGN PATENT DOCUMENTS

DE 102008026432 12/2009

(Continued)

OTHER PUBLICATIONS

Adee, S., "Quantum Tunneling Creates Fast Lane for Wireless", IEEE Spectrum, Oct. 2007.

(Continued)

*Primary Examiner* — Alexander Sofocleous
*Assistant Examiner* — Harry W Byrne
(74) *Attorney, Agent, or Firm* — Mueting Raasch & Gebhardt PA

(57) ABSTRACT

A transmission gate-based spin-transfer torque memory unit is described. The memory unit includes a magnetic tunnel junction data cell electrically coupled to a bit line and a source line. A NMOS transistor is in parallel electrical connection with a PMOS transistor and they are electrically connected with the source line and the magnetic tunnel junction data cell. The magnetic tunnel junction data cell is configured to switch between a high resistance state and a low resistance state by passing a polarized write current through the magnetic tunnel junction data cell. The PMOS transistor and the NMOS transistor are separately addressable so that a first write current in a first direction flows through the PMOS transistor and a second write current in a second direction flows through the NMOS transistor.

20 Claims, 2 Drawing Sheets

U.S. PATENT DOCUMENTS

| | | |
|---|---|---|
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |
| 5,926,412 A | 7/1999 | Evans |
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Kaloyeros |
| 6,376,332 B1 | 4/2002 | Yanagita |
| 6,448,840 B2 | 9/2002 | Kao |
| 6,534,382 B1 | 3/2003 | Sakaguchi |
| 6,617,642 B1 | 9/2003 | Georgescu |
| 6,624,463 B2 | 9/2003 | Kim |
| 6,653,704 B1 | 11/2003 | Gurney |
| 6,667,900 B2 | 12/2003 | Lowrey |
| 6,750,540 B2 | 6/2004 | Kim |
| 6,753,561 B1 | 6/2004 | Rinerson |
| 6,757,842 B2 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,917,539 B2 | 7/2005 | Rinerson |
| 6,927,468 B2 * | 8/2005 | Yoda et al. .................... 257/422 |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,180,140 B1 | 2/2007 | Brisbin |
| 7,187,577 B1 | 3/2007 | Wang |
| 7,190,616 B2 | 3/2007 | Forbes |
| 7,200,036 B2 | 4/2007 | Bessho |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Joshi |
| 7,382,024 B2 | 6/2008 | Ito |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,542,356 B2 | 6/2009 | Lee |
| 7,646,629 B2 | 1/2010 | Hamberg |
| 7,697,322 B2 | 4/2010 | Leuschner |
| 7,738,279 B2 | 6/2010 | Siesazeck |
| 7,738,881 B2 | 6/2010 | Krumm |
| 2002/0081822 A1 | 6/2002 | Yanageta |
| 2002/0135955 A1 * | 9/2002 | Ono et al. ................ 360/324.12 |
| 2002/0136047 A1 | 9/2002 | Scheuerlein |
| 2003/0045064 A1 | 3/2003 | Kunikiyo |
| 2003/0168684 A1 | 9/2003 | Pan |
| 2003/0184918 A1 * | 10/2003 | Lin et al. ........................ 360/314 |
| 2003/0235016 A1 * | 12/2003 | Gill .......................... 360/324.12 |
| 2004/0021189 A1 * | 2/2004 | Yoda et al. .................... 257/421 |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0249428 A1 * | 12/2004 | Wang et al. .................... 607/116 |
| 2004/0257878 A1 | 12/2004 | Morikawa |
| 2004/0262635 A1 | 12/2004 | Lee |
| 2005/0018476 A1 * | 1/2005 | Kamijima et al. ............. 365/158 |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ |
| 2005/0174821 A1 * | 8/2005 | Zheng et al. ....................... 365/8 |
| 2005/0201022 A1 * | 9/2005 | Horng et al. ............. 360/324.11 |
| 2005/0218521 A1 | 10/2005 | Lee |
| 2005/0237787 A1 * | 10/2005 | Huai et al. .................... 365/158 |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0077707 A1 * | 4/2006 | Deak ............................. 365/171 |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0096229 A1 * | 5/2007 | Yoshikawa et al. ........... 257/421 |
| 2007/0105241 A1 | 5/2007 | Leuschner |
| 2007/0113884 A1 | 5/2007 | Kensey |
| 2007/0115749 A1 | 5/2007 | Gilbert |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 | 12/2007 | Chen |
| 2008/0007993 A1 | 1/2008 | Saitoh |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0094873 A1 | 4/2008 | Lai |
| 2008/0108212 A1 | 5/2008 | Moss |
| 2008/0144355 A1 | 6/2008 | Boeve |
| 2008/0170432 A1 | 7/2008 | Asao |
| 2008/0191312 A1 | 8/2008 | Oh |
| 2008/0203443 A1 | 8/2008 | Wilson |
| 2008/0219044 A1 * | 9/2008 | Yoon et al. .................... 365/158 |
| 2008/0261380 A1 | 10/2008 | Lee |
| 2008/0265360 A1 | 10/2008 | Lee |
| 2008/0273380 A1 | 11/2008 | Diao |
| 2008/0310213 A1 | 12/2008 | Chen |
| 2008/0310219 A1 | 12/2008 | Chen |
| 2009/0014719 A1 | 1/2009 | Shimizu |
| 2009/0040855 A1 | 2/2009 | Luo |

| | | | |
|---|---|---|---|
| 2009/0052225 | A1 | 2/2009 | Morimoto |
| 2009/0072246 | A1 | 3/2009 | Genrikh |
| 2009/0072279 | A1 | 3/2009 | Moselund |
| 2009/0161408 | A1 | 6/2009 | Tanigami |
| 2009/0162979 | A1 | 6/2009 | Yang |
| 2009/0185410 | A1 | 7/2009 | Huai |
| 2009/0296449 | A1 | 12/2009 | Slesazeck |
| 2010/0007344 | A1 | 1/2010 | Guo |
| 2010/0067281 | A1 | 3/2010 | Xi |
| 2010/0110756 | A1 | 5/2010 | Khoury |
| 2010/0142256 | A1 | 6/2010 | Kumar |
| 2010/0149856 | A1 | 6/2010 | Tang |

FOREIGN PATENT DOCUMENTS

| | | |
|---|---|---|
| EP | 1329895 | 7/2003 |
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Berger et al., Merged-Transitor Logic (MTL)—A Low-Cost Bipolar Logic Concept, Solid-State Circuits, IEEE Journal, vol. 7, Issue 5, pp. 340-346 (2003).

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l. Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Sayan, S., "Valence and conduction band offsets of a ZrO2/SiOxNy/n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al., Our Ref: 14229.00.

U.S. Appl. No. 12/120,715, filed May 15, 2008, Inventors: Tian et al.

U.S. Appl. No. 12/498,661, filed Jul. 7, 2009, Inventor: Khoury.

U.S. Appl. No. 12/502,211, filed Jul. 13, 2009, Inventor: Lu.

Wang et al., Precision Control of Halo Implanation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

* cited by examiner

US 8,199,563 B2

TRANSMISSION GATE-BASED SPIN-TRANSFER TORQUE MEMORY UNIT

RELATED APPLICATION

This application is a continuation of U.S. patent application Ser. No. 12/170,549, filed on Jul. 10, 2008. The entire disclosure of application Ser. No. 12/170,549 is incorporated herein by reference.

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market by 2009. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One challenge is that as the technology scales below 0.13 micrometer, the driving ability (in opposing directions) across the STRAM become more asymmetric requiring the NMOS transistor of the STRAM to increase in area which limits the ability to scale down the technology.

BRIEF SUMMARY

The present disclosure relates to spin-transfer torque random access memory. In particular, present disclosure relates to STRAM that includes a transmission gate that provides symmetric driving ability (e.g., switching between low and high data resistance states) across the STRAM. The symmetric driving ability can be achieved even at a low voltage level and for scaled technology below 0.13 micrometers.

One illustrative transmission gate-based memory unit includes a magnetic tunnel junction data cell electrically coupled to a bit line and a source line. A NMOS transistor is in parallel electrical connection with a PMOS transistor and they are electrically connected with the source line and the magnetic tunnel junction data cell. The magnetic tunnel junction data cell is configured to switch between a high resistance state and a low resistance state by passing a polarized write current through the magnetic tunnel junction data cell. The PMOS transistor and the NMOS transistor are separately addressable so that a first write current in a first direction flows through the PMOS transistor and a second write current in a second direction flows through the NMOS transistor.

An illustrative spin-transfer torque memory unit includes a bit line, a source line, a magnetic tunnel junction data cell electrically coupled to the bit line and the source line and a transmission gate electrically between the source line and the magnetic tunnel junction data cell. The transmission gate includes a NMOS transistor in parallel electrical connection with a PMOS transistor. The PMOS transistor and the NMOS transistor are separately addressable so that a first write current in a first direction flows through the PMOS transistor and not the NMOS transistor and a second write current in a second direction flows through the NMOS transistor and not the PMOS transistor.

Another illustrative spin-transfer torque memory apparatus includes a bit line, a source line, a magnetic tunnel junction data cell and a transmission gate electrically between the source line and the magnetic tunnel junction data cell. The transmission gate includes a NMOS transistor in parallel electrical connection with a PMOS transistor. The NMOS transistor includes a NMOS gate electrode and the PMOS transistor includes a PMOS gate electrode. A first word line is electrically coupled to the NMOS gate electrode and a second word line is electrically coupled to the PMOS gate electrode. The second word line is electrically isolated from the first word line. The spin-transfer torque memory unit is configured so that a first write current in a first direction flows through the PMOS transistor and not the NMOS transistor and a second write current in a second direction flows through the NMOS transistor and not the PMOS transistor.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to spin-transfer torque random access memory (STRAM). In particular, present disclosure relates to STRAM that includes a transmission gate that provides symmetric driving ability (e.g., switching between low and high data resistance states) across the STRAM. The symmetric driving ability can be achieved even at a low voltage level and for scaled technology below 0.13 micrometers. Symmetric driving ability is achieved by providing a transmission gate between the spin-transfer torque magnetic tunnel junction (MTJ) memory unit and a bit line or source line. The transmission gate includes an NMOS transistor in parallel electrical connection with a PMOS transistor. The NMOS transistor and PMOS transistor are separately addressable such that only the NMOS transistor is activated to allow current flow in a first direction and only the PMOS transistor is activated to allow current flow in a second direction. While the present disclosure is not so limited, an appreciation of various aspects of the disclosure will be gained through a discussion of the examples provided below.

Figure 1:
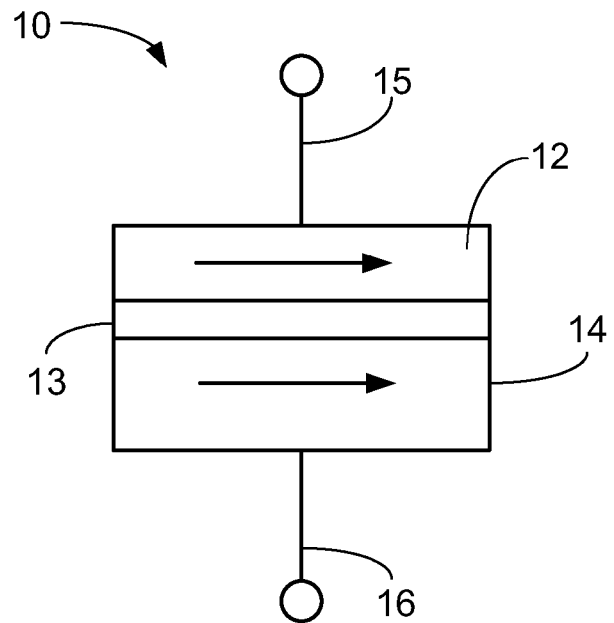
FIG. 1 is a cross-sectional schematic diagram of an illustrative spin-transfer torque MTJ memory unit in the low resistance state.
Figure 2:
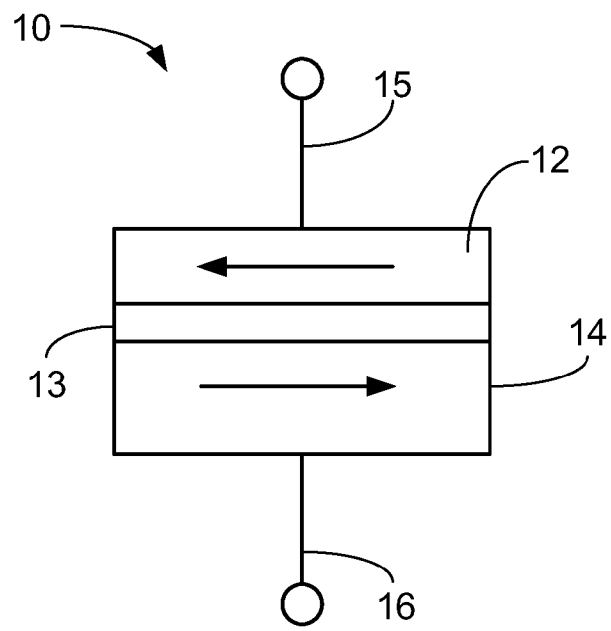
FIG. 2 is a cross-sectional schematic diagram of another spin-transfer torque MTJ memory unit in the high resistance state.

FIG. 1 is a cross-sectional schematic diagram of an illustrative spin-transfer torque MTJ memory unit 10 (e.g. STRAM) in the low resistance state and FIG. 2 is a cross-sectional schematic diagram of another spin-transfer torque MTJ memory unit 10 (e.g. STRAM) in the high resistance state. A magnetic tunnel junction (MTJ) memory unit 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the spin-transfer torque MTJ memory unit 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the spin-transfer torque MTJ memory unit 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the spin-transfer torque MTJ memory unit 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ memory unit 10 via spin-transfer occurs when a current, passing through a magnetic layer of the MTJ memory unit 10, becomes spin polarized and imparts a spin torque on the free layer 12 of the MTJ 10. When a sufficient spin torque is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the current.

The illustrative spin-transfer torque MTJ memory unit 10 may be used to construct a memory device that includes multiple MTJ memory units where a data bit is stored in spin-transfer torque MTJ memory unit by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ memory unit 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
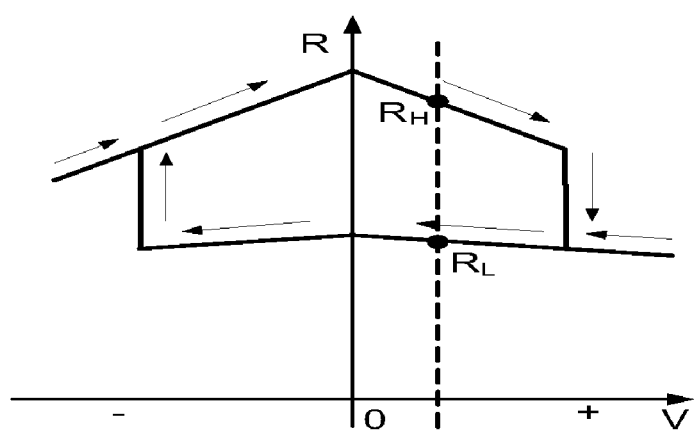
FIG. 3 is a graph of a static R-V (resistance-voltage) curve of a spin-transfer torque MTJ memory unit.

FIG. 3 is a graph of a static R-V sweep curve of a spin-transfer torque MTJ memory unit. When applying a positive voltage on the second electrode 16 in FIG. 1 or 2, the MTJ 10 enters the positive applied voltage region in FIG. 3 and switches from the high resistance state (FIG. 2) to the low resistance state (FIG. 1). When applying a positive voltage on the first electrode 15 in FIG. 1 or 2, the MTJ 10 enters the negative applied voltage region in FIG. 3. The resistance of the MTJ switches from the low resistance state (FIG. 1) to the high resistance state (FIG. 2).

Let $R_H$ and $R_L$ denote the high and low MTJ resistance, respectively. We define the Tunneling Magneto Resistance Ratio (TMR) as TMR=$(R_H-R_L)/R_L$. Here $R_H$, $R_L$ and TMR are determined by also the sensing current or voltage, as shown in FIG. 3. Generally, a large TMR makes it easier to distinguish the two resistance states of the MTJ.

Figure 4:
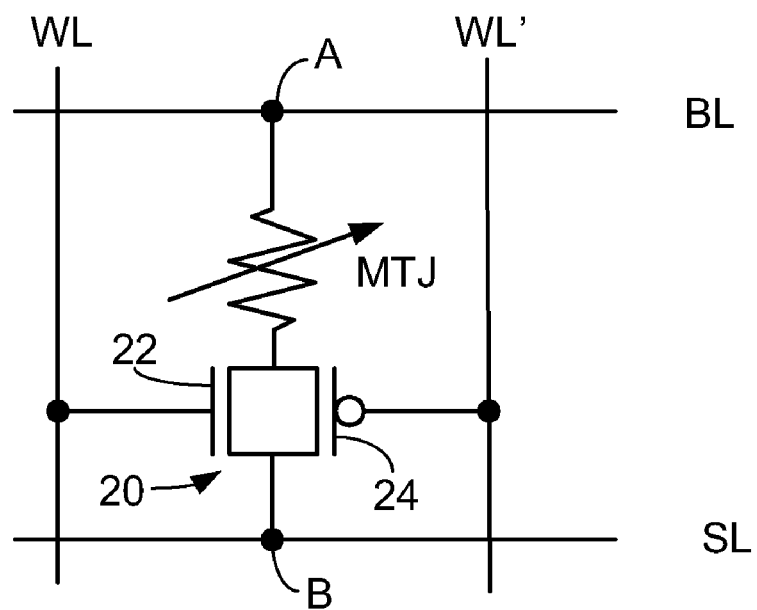
FIG. 4 is a schematic circuit diagram of a spin-transfer torque MTJ memory unit.

FIG. 4 is a schematic diagram of a spin-transfer torque memory unit. The magnetic tunnel junction data cell MTJ is electrically connected in series to a transmission gate 20. The opposing side of the magnetic tunnel junction data cell MTJ is electrically connected to a bit line BL. The transmission gate 20 is electrically between a source line SL and magnetic tunnel junction data cell MTJ. The MTJ is usually modeled as a variable resistor in circuit schematic, as shown in FIG. 4. The magnetic tunnel junction data cell MTJ is configured to switch between a high resistance state by passing a polarized write current through the magnetic tunnel junction data cell MTJ in a first direction and a low resistance state by passing a polarized write current through the magnetic tunnel junction data cell MTJ in a second direction. The second direction opposes the first direction.

The transmission gate 20 includes a NMOS (N-type metal-oxide-semiconductor) transistor 22 in parallel electrical connection with a PMOS (P-type metal-oxide-semiconductor) transistor 24. A gate electrode of the NMOS transistor 22 is electrically coupled to a first word line WL. A gate electrode of the PMOS transistor 24 is electrically coupled to a second word line WL'. In many embodiments, the first word line WL is electrically isolated from the second word line WL' so that the first word line WL is separately addressable from the second word line WL'. In many embodiments, the NMOS transistor 22 and the PMOS transistor 24 share a common source and a common drain. The NMOS transistor 22 includes an N-channel in a P-well or P-substrate. The PMOS transistor 24 includes a P-channel in an N-well or N-substrate.

The PMOS transistor 24 and the NMOS transistor 22 are separately addressable so that a first write current in a first direction (e.g., from node A to node B for example) flows through the NMOS transistor 22 and not the PMOS transistor 24 to write a first resistance data state (e.g., a low data resistance state or "0", for example) by activating the gate electrode of the NMOS transistor 22. A second write current in a second direction (e.g., from node B to node A for example) flows through the PMOS transistor 24 and not the NMOS transistor 22 to write a second resistance data state (e.g., a high data resistance state or "0", for example) by activating the gate electrode of the PMOS transistor 24.

One illustrative advantage of this spin-transfer torque memory unit is that when driving current from node B to node A the voltage potential difference between the oxide gate and the source of the PMOS transistor is kept at the supply voltage. Therefore, one transistor: NMOS for driving current from node A to node B; and PMOS for driving current from node B to node A, will provide full driving ability for either driving direction. Thus, the transmission gate has a symmetric driving ability for the first write current and the second write current.

In many embodiments, the driving ability of the PMOS transistor is weaker than the one of a NMOS transistor with the same size. Therefore, a PMOS transistor larger than the NMOS transistor is utilized for driving current from node B to node A. Besides providing symmetric driving ability, this disclosure can easily provide any asymmetric driving ability if necessary for example, asymmetric writing currents of MTJ, by tuning the sizes of PMOS and NMOS transistors separately.

In many embodiments, the symmetric driving ability for the first and second write currents is achieved with a voltage of ±1.5V or less is applied across the spin-transfer torque memory unit. In many embodiments, the NMOS gate electrode has a gate length value of 0.13 micrometer or less, or in a range from 0.032 micrometer to 0.10 micrometer. In many embodiments, the PMOS gate electrode has a gate length value of 0.13 micrometer or less, or in a range from 0.032 micrometer to 0.10 micrometer.

In some embodiments, the PMOS transistor is body biased. Body biasing the body (the well, for example) of a transistor refers to measuring a parameter of the transistor, and responsive to the parameter, forward biasing the body of the transistor. The parameter being measured can be, among others, a voltage threshold of the transistor, or a delay characteristic of the transistor. A body biasing signal can be applied to the body of the PMOS transistor. In some embodiments, when writing data through the PMOS transistor, the voltage level of the PMOS body is pulled up to increase the driving strength of the PMOS transistor.

Thus, embodiments of the TRANSMISSION GATE-BASED SPIN-TRANSFER TORQUE MEMORY UNIT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory unit comprising:
   a magnetic tunnel junction data cell configured to switch between a high resistance state and a low resistance state by passing a polarized write current through the magnetic tunnel junction data cell; and
   a NMOS transistor in parallel electrical connection with a PMOS transistor, the NMOS transistor and the PMOS transistor electrically connected with the magnetic tunnel junction data cell, a first write current in a first direction flows through the PMOS transistor and a second write current in a second direction flows through the NMOS transistor.

2. A memory unit according to claim 1, wherein the NMOS transistor comprises a NMOS gate electrode electrically coupled to a first word line, and the PMOS transistor comprises a PMOS gate electrode electrically coupled to a second word line and the first word line is separately addressable from the second word line.

3. A memory unit according to claim 1, wherein the spin-transfer torque memory unit has a symmetric driving ability for the first write current and the second write current.

4. A memory unit according to claim 1, wherein the spin-transfer torque memory unit has a symmetric driving ability for the first write current and the second write current when a voltage of 1.5V or less is applied across the spin-transfer torque memory unit.

5. A memory unit according to claim 1, wherein the PMOS transistor is body biased.

6. A memory unit according to claim 1, wherein the NMOS transistor comprises a NMOS gate electrode having a gate length value of 0.13 micrometer or less.

7. A memory unit according to claim 1, wherein the NMOS transistor comprises a NMOS gate electrode having a gate length value in a range from 0.032 micrometer to 0.10 micrometer and the spin-transfer torque memory unit has a symmetric driving ability for the first write current of 1.5V or less and the second write current of −1.5V or less.

8. A spin-transfer torque memory unit comprising:
a magnetic tunnel junction data cell configured to switch between a high resistance state and a low resistance state by passing a polarized write current through the magnetic tunnel junction data cell; and
a transmission gate electrically coupled to the magnetic tunnel junction data cell, the transmission gate comprising:
a NMOS transistor in parallel electrical connection with a PMOS transistor, a first write current in a first direction flows through the PMOS transistor and not the NMOS transistor and a second write current in a second direction flows through the NMOS transistor and not the PMOS transistor.

9. A spin-transfer torque memory unit according to claim 8, wherein the NMOS transistor comprises a NMOS gate electrode electrically coupled to a first word line, and the PMOS transistor comprises a PMOS gate electrode electrically coupled to a second word line and the first word line is separately addressable from the second word line.

10. A spin-transfer torque memory unit according to claim 8, wherein the spin-transfer torque memory unit has a symmetric driving ability for the first write current and the second write current.

11. A spin-transfer torque memory unit according to claim 8, wherein the spin-transfer torque memory unit has a symmetric driving ability for the first write current and the second write current when a voltage of 1.5V or less is applied across the spin-transfer torque memory unit.

12. A spin-transfer torque memory unit according to claim 8, wherein the PMOS transistor is body biased.

13. A spin-transfer torque memory unit according to claim 8, wherein the NMOS transistor comprises a NMOS gate electrode having a gate length value of 0.13 micrometer or less.

14. A spin-transfer torque memory unit according to claim 13, wherein spin-transfer torque memory unit has a symmetric driving ability for the first write current of 1.5V or less and the second write current of −1.5V or less.

15. A spin-transfer torque memory unit comprising:
a magnetic tunnel junction data cell comprising a ferromagnetic free layer and a ferromagnetic reference layer separated by a oxide barrier layer, the magnetic tunnel junction data cell is configured to switch between a high resistance state and a low resistance state by passing a polarized write current through the magnetic tunnel junction data cell; and
a transmission gate electrically between the source line and the magnetic tunnel junction data cell, the transmission gate comprising:
a NMOS transistor in parallel electrical connection with a PMOS transistor, the NMOS transistor comprising a NMOS gate electrode and the PMOS transistor comprising a PMOS gate electrode;
a first word line is electrically coupled to the NMOS gate electrode; and
a second word line is electrically coupled to the PMOS gate electrode, the second word line being electrically isolated from the first word line;
wherein, the spin-transfer torque memory unit is configured so that a first write current in a first direction flows through the PMOS transistor and not the NMOS transistor and a second write current in a second direction flows through the NMOS transistor and not the PMOS transistor.

16. A spin-transfer torque memory unit according to claim 15, wherein the spin-transfer torque memory unit has a symmetric driving ability for the first write current and the second write current.

17. A spin-transfer torque memory unit according to claim 15, wherein the spin-transfer torque memory unit has a symmetric driving ability for the first write current and the second write current when a voltage of 1.5V or less is applied across the spin-transfer torque memory unit.

18. A spin-transfer torque memory unit according to claim 15, wherein the PMOS transistor is body biased.

19. A spin-transfer torque memory unit according to claim 15, wherein the NMOS transistor comprises a NMOS gate electrode having a gate length value of 0.13 micrometer or less.

20. A spin-transfer torque memory unit according to claim 19, wherein spin-transfer torque memory unit has a symmetric driving ability for the first write current of 1.5V or less and the second write current of −1.5V or less.

* * * * *